(12) United States Patent
Kim

(10) Patent No.: US 8,633,532 B2
(45) Date of Patent: Jan. 21, 2014

(54) SEMICONDUCTOR MEMORY DEVICE HAVING A FLOATING BODY CAPACITOR, MEMORY CELL ARRAY HAVING THE SAME AND METHOD OF MANUFACTURING THE SAME

(75) Inventor: Jong Su Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 53 days.

(21) Appl. No.: 13/304,470

(22) Filed: Nov. 25, 2011

(65) Prior Publication Data

US 2012/0068239 A1 Mar. 22, 2012

Related U.S. Application Data

(63) Continuation-in-part of application No. 12/181,220, filed on Jul. 28, 2008, now abandoned.

(30) Foreign Application Priority Data

Dec. 12, 2007 (KR) .......................... 10-2007-0129024

(51) Int. Cl.
   *H01L 27/12* (2006.01)
(52) U.S. Cl.
   USPC ................ 257/300; 257/E27.112; 257/E21.7; 438/155

(58) Field of Classification Search
   USPC ................ 257/300, E27.112, E21.7; 438/155
   See application file for complete search history.

(56) References Cited

U.S. PATENT DOCUMENTS

| 2003/0134514 A1* | 7/2003 | Jang et al. ...................... 438/694 |
| 2004/0129977 A1* | 7/2004 | Ohkubo et al. ............... 257/347 |
| 2005/0167751 A1* | 8/2005 | Nakajima et al. ............. 257/347 |
| 2009/0003105 A1* | 1/2009 | Itoh et al. ...................... 365/203 |

* cited by examiner

Primary Examiner — Marc Armand
(74) Attorney, Agent, or Firm — William Park & Associates Patent Ltd.

(57) ABSTRACT

A semiconductor memory device having a floating body capacitor. The semiconductor memory device can perform a memory operation using the floating body capacitor. The semiconductor memory device includes an SOI substrate having a staked structure in which a base substrate having a conducting surface, a buried insulating layer and a device-forming layer are staked, a transistor formed in a portion of the device-forming layer, having a gate, a source region and a drain region, and a capacitor formed by the buried insulating layer, the conducting surface of the base substrate, and accumulated holes generated in the device-forming layer when the transistor is driven.

14 Claims, 4 Drawing Sheets

US 8,633,532 B2

SEMICONDUCTOR MEMORY DEVICE HAVING A FLOATING BODY CAPACITOR, MEMORY CELL ARRAY HAVING THE SAME AND METHOD OF MANUFACTURING THE SAME

CROSS-REFERENCES TO RELATED APPLICATION

This application is a continuation-in-part of application Ser. No. 12/181,220, filed on Jul. 28, 2008, titled "A semiconductor memory device having a floating body capacitor and method of manufacturing the same", which is incorporated herein by reference in its entirety as if set forth in full, and which claims priority under 35 U.S.C. 119(a) to Korean application number 10-2007-0129024, filed on Dec. 12, 2007, in the Korean Intellectual Property Office, which is incorporated by reference in its entirety as if set forth in full.

BACKGROUND

1. Technical Field

The embodiments described herein relate to semiconductor memory devices and a methods of manufacturing the same and, more particularly, to a semiconductor memory device having a capacitor which is formed in a substrate and a method of manufacturing the same.

2. Related Art

A conventional Dynamic Random Access Memory (DRAM) device includes a storage cell that is made up of a capacitor. Memory operations are carried out by the charging and discharging of the capacitor.

The capacitor in a conventional DRAM is formed either as a stack type structure on a semiconductor substrate or as a trench structure in the semiconductor substrate. Recently, as the integration of conventional semiconductor memory device has increased, the patterns used to form various structures within the device have decreased, as has the size of the capacitor used to form the memory cells in a conventional DRAM. However, the capacitance must still remain the same, or even be higher, in spite of the reduced size of the capacitor.

There are several methods that can be used to maintain or increase the capacitance. Fore example, one method is to increase an area of a lower electrode that forms part of the capacitor. Another method is to make a dielectric layer forming part of the capacitor thin.

In the first method, i.e., increasing the area of the lower electrode, a 3-dimensional structure is employed in the capacitor. For example, the 3-dimensional structure can be a cylindrical or fin structure. This method of using a 3-dimensional lower electrode can increase the capacitance of the capacitor; however, complex manufacturing processes are needed and breakage of the lower electrode is common.

The second method, i.e., making the dielectric layer thin, runs into permittivity limits. That is, a conventional dielectric layer is formed by a silicon oxide ($SiO_2$) layer or an ONO (oxide-nitride-oxide) layer of a thickness of below at least 100 (10 nm) to obtain the required capacitance. However, in the case that the silicon oxide layer and the ONO layer are formed to a thickness of below 100, the reliability of the thin film deteriorates and leakage current can result.

SUMMARY

A semiconductor memory device capable of performing a memory operation with no capacitor and a method for manufacturing the same are described herein.

According to one aspect, a semiconductor memory device comprises an SOI substrate having a staked structure in which a base substrate having a conducting surface, a buried insulating layer and a device-forming layer are staked, a transistor formed in a portion of the device-forming layer, having a gate, a source region and a drain region, and a capacitor formed by the buried insulating layer, the conducting surface of the base substrate, and accumulated holes is generated in the device-forming layer when the transistor is driven.

According to another aspect, a method for forming a semiconductor memory device comprises providing an SOI substrate, wherein the SOI substrate includes a base substrate having a conducting surface, a buried insulating layer and a device-forming layer, forming a transistor having a gate, a source region and a drain region on the SOI substrate, and forming a contact plug which is in contact with the conducting surface of the base substrate, wherein an adjustable bias voltage is applied to the contact plug.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

An SOI memory device in accordance with the embodiments described herein can have a virtual capacitor as a result of holes accumulated in a floating body. As described below, the virtual capacitor can serve as a storage member of memory device. A bottom portion of a buried insulating layer in the SOI memory device can be used as a conducting layer in order to control the holes accumulated in the floating body.

Figure 1:
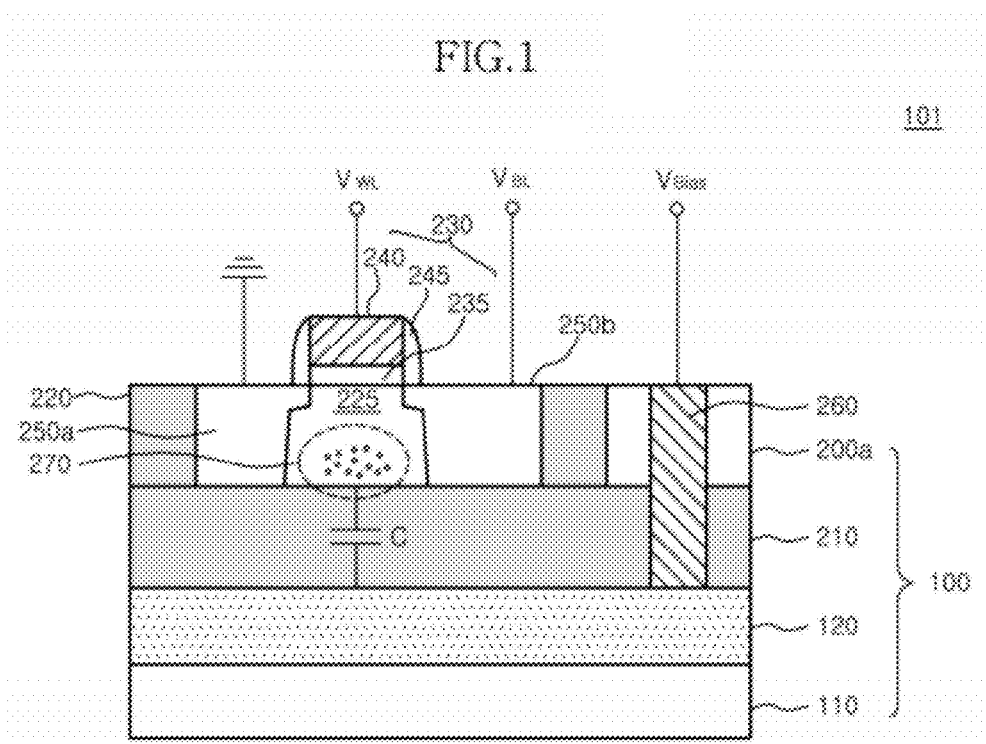
FIG. 1 is a cross-sectional view of an SOI memory device having a floating body capacitor according to one embodiment.

FIG. 1 is a cross sectional view illustrating a SOI memory device 101 comprising a virtual capacitor in accordance with one embodiment. Referring to FIG. 1, the SOI memory device 101 can be formed on an SOI substrate 100. The SOI substrate 100 can include a base substrate 110, a buried insulating layer 210 and a device-forming layer 200a.

An isolation layer 220 can be formed in a portion of the device-forming layer 200a and an active region 225 can be defined by the isolation layer 220. For example, an STI (shallow trench isolation) layer can be used as the isolation layer 220 and a bottom portion of the isolation layer 220 can be in contact with the buried insulating layer 210. The active region 225 can be completely isolated by both the isolation layer 220 and the buried insulating layer 210.

A gate structure 230 can be formed in a portion of the active is region 225. The gate structure 230 can include a gate oxide layer 235, a gate electrode 240 and insulating spacers 245. The gate oxide layer 235 can electrically isolate the device-forming layer 200a from the gate electrode 240. Further, a voltage $V_{WL}$ for selecting a word line can be applied to the gate electrode 240. Insulating spacers 245 can also be selectively formed on the sidewalls of the gate electrode 240.

Impurities can be injected into both sides of the gate structure 230, thereby forming source/drain regions 250a and 250b. The source/drain regions 250a and 250b can be formed in a type of a LDD (lightly doped drain) using the insulating spacers 245. In one embodiment, the transistor in the SOI memory device can form a fully depleted transistor in which a depth of the depletion regions of the source/drain regions 250a and 250b is the same as the thickness of the device-forming layer 200a when voltages are applied to the source/drain regions 250a and 250b. That is, the bottom surfaces of the depleted source/drain regions 250a and 250b can be in contact with the buried insulating layer 210.

Furthermore, the source/drain regions 250a and 250b can form a partially depleted transistor. In this case, the bottom portions of the depleted source/drain regions 250a and 250b can be spaced apart from the buried insulating layer 210.

The word line select voltage $V_{WL}$ can be applied to the gate structure 230, and a ground voltage and a bit line voltage $V_{BL}$ can be applied to the source region 250a and the drain region 250b, respectively, to drive the SOI memory device.

When the voltages are applied to the gate structure 230 and the source/drain regions 250a and 250b, an electric field is formed between the source region 250a and the drain region 250b and a strong electric field is formed between the gate structure 230 and the drain region 250b. As a result, EHPs (electron-hole-pairs) are generated in the device-forming layer 200a.

At this time, holes that are not combined with electrons are accumulated at the bottom portion of the device-forming layer 200a. The accumulated holes 270 form a potential energy such that the accumulated holes 270 have an effect on the threshold voltage (Vt) of the transistor. This is called as a floating body effect. Since a drain current can be dramatically increased by the accumulated holes 270, the floating body effect is also called a Kink effect.

A device 101 configured as described herein can use the accumulated holes 270 as an electrode of a memory device by detecting the drain current being controlled by the holes 270 accumulated by the floating body effect.

More specifically, a virtual capacitor is formed by the accumulated holes 270, the buried insulating layer 210 and the base substrate 110, by making the bottom portion of the buried insulating layer 210 conductive.

The conductivity of the bottom portion of the buried insulating layer 210 can be obtained by providing the conductivity to the base substrate 110, which is positioned below the buried insulating layer 210. The conductivity of the base substrate 110 can be achieved by is forming a conducting layer on the base substrate 110. The conducting layer can be a conductive material deposited on the base substrate 110 or a conductive well 120 provided in the base substrate 110.

In case of the well 120, an N-type conducting layer can be used as the well 120. A voltage can be applied to the conducting layer, i.e., the well 120, through a contact plug 260 to penetrate the device-forming layer 200a and the buried insulating layer 210. A voltage $V_{bias}$ applied to the well 120 can control the accumulated holes 270 by performing charging and discharging operations.

It can be preferable that the buried insulating layer 210 has a thickness of approximately 4000 to 6000 in order to support the charging and discharging operations.

Figure 2:
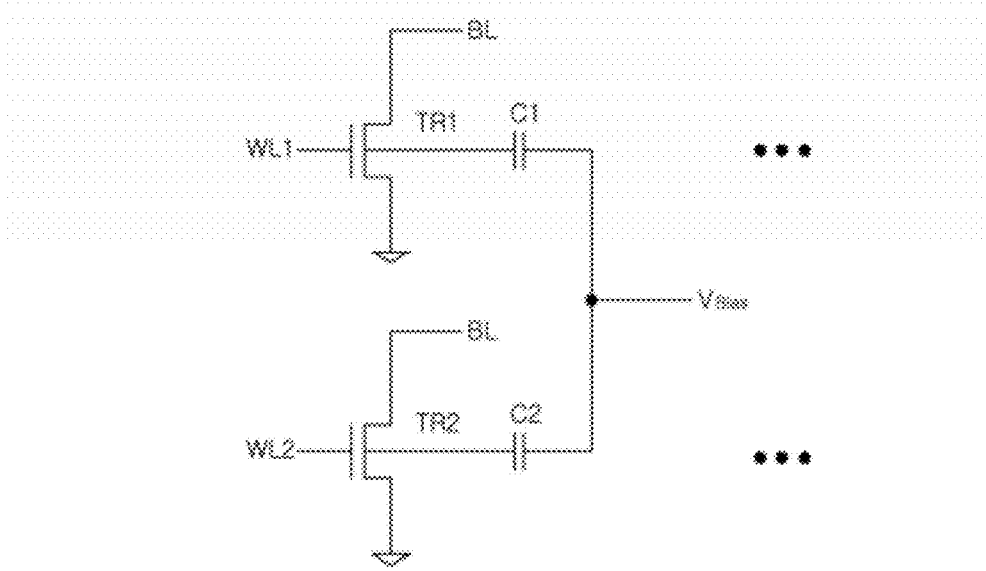
FIG. 2 is a diagram showing an equivalent circuit of the SOI memory device of FIG. 1.

FIG. 2 is a circuit diagram illustrating an equivalent circuit for the device illustrated in FIG. 1. Referring to FIG. 2, transistors TR1 and TR2 formed on the SOI substrate make the bit line voltage VBL stored in substrate capacitors C1 and C2 respectively, when the word line select signal is applied to the gate structure 230. At this time, the substrate capacitors C1 and C2, which are formed between the device-forming layer and the base substrate 110, can be controlled by the bias voltage $V_{bias}$. The bias voltage $V_{bias}$ can be adjustable such that the charges stored in the capacitors C1 and C2 can be controlled in the charging and discharging operation.

Figure 3:
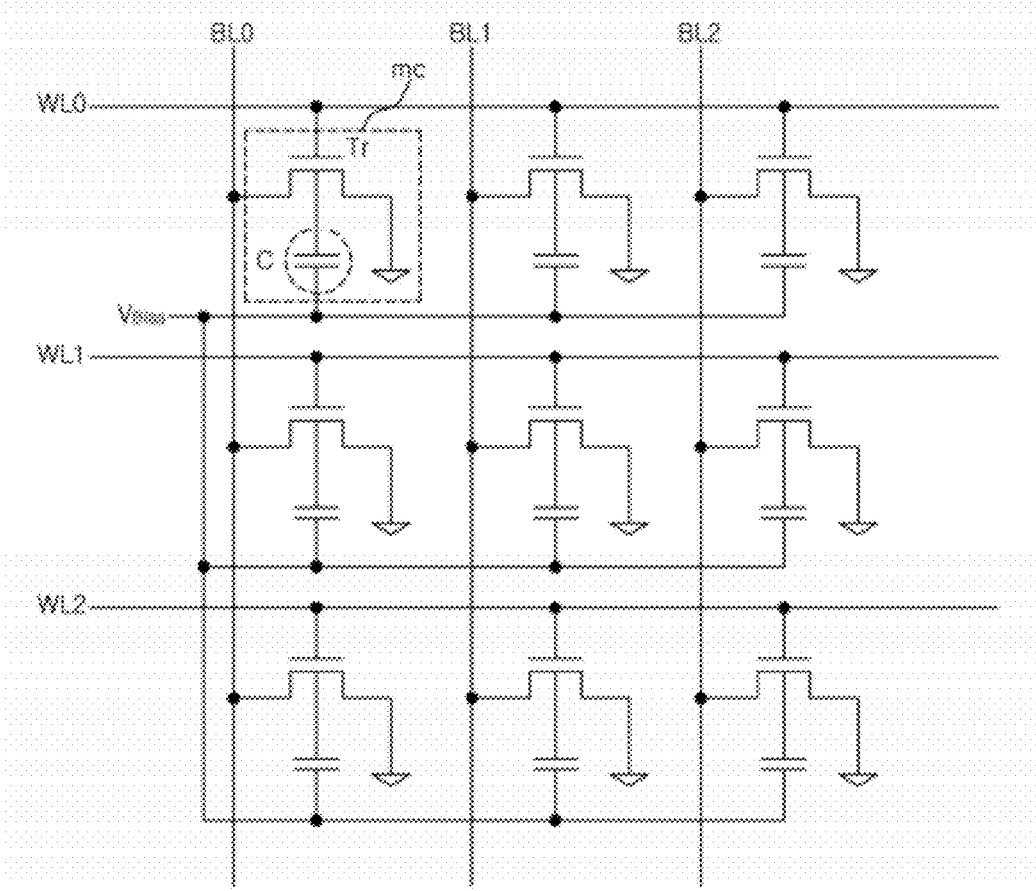
FIG. 3 is a circuit diagram showing a memory cell array of the SOI memory device according to one of embodiments.

FIG. 3 is a circuit diagram of a memory cell array of the SOI is memory device according to the embodiment. Referring to FIG. 3, the memory cell array may include a plurality of word lines WL0 to WL2, a plurality of bit lines BL0 to BL2, which are arranged to intersect with each other, and a plurality of memory cells 'mc'. The memory cells 'mc' are formed in respective points of intersection of the plurality of word lines WL0-WL2 with the plurality of bit lines BL0 to BL2, respectively. Respective the memory cells 'mc' may include a transistor Tr which are connected between one of the word lines WL0 to WL2 and one of the bit lines BL0 to BL2 and a capacitor C which are connected between a body(or bulk) of the transistor and a bias line $V_{Bias}$. The transistor is driven in response to a signal of corresponding word line, and a data of corresponding bit line is charged/discharged in the capacitor C according to a driving of the transistor Tr.

In this embodiment, the capacitor C is a parasitic capacitor, which are formed in the SOI substrate 100 and is used as a memory means. Thus, there is no need for an area for forming the capacitor and complex processes for forming the capacitor.

A method for manufacturing the SOI memory device of FIG. 1 will be described in detail referring to FIGS. 4 to 7.

Figure 4:
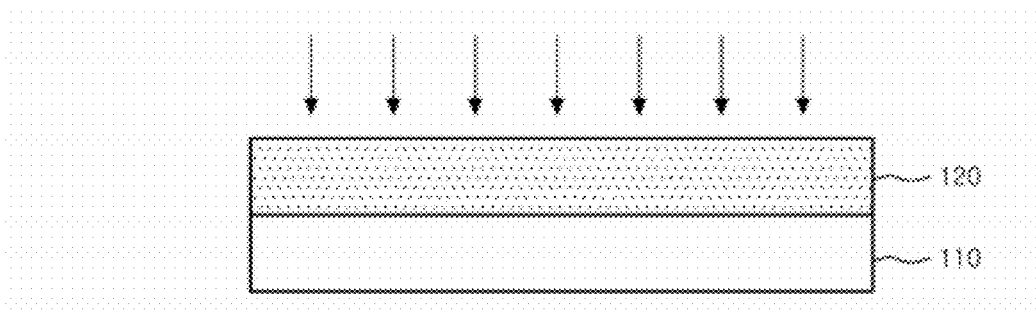
FIGS. 4 to 7 are cross-sectional views illustrating a method for manufacturing the SOI memory device of FIG. 1 according to one embodiment.

First, referring to FIG. 4, a base substrate 110 can be provided. Depending on the embodiment, the base substrate 110 can be a pure silicon substrate that does not undergo any treatment. Impurity ions can then be injected into the base substrate 110 and a well 120 can be formed by the activation of the impurity ions. For example, the well 120 can have N-type impurity ions. In this case, is phosphorus ions can be used as the N-type impurity ions.

Figure 5:
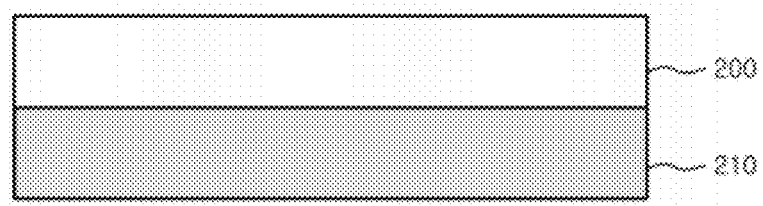
Figure 5:
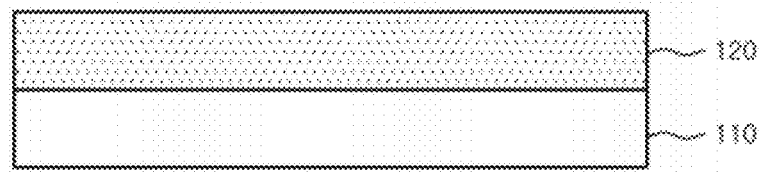

In other embodiments, a conductive layer can be deposited on the base substrate 110 instead of the formation of the well 120, As shown in FIG. 5, a buried insulating layer 210 can be formed on a surface of an attachment substrate 200. The buried insulating layer 210 can be obtained by oxidizing a portion of the attachment substrate 200 or by depositing an oxide layer on the attachment substrate 200. The buried insulating layer 210 can be formed to a thickness of approximately 4000 to 6000 to guarantee a stable operation of the capacitor. The buried insulating layer 210 of the attachment substrate 200 can then be attached to the well 120 of the base substrate 110 such that the attachment substrate 200 is opposite to the well 120.

Figure 6:
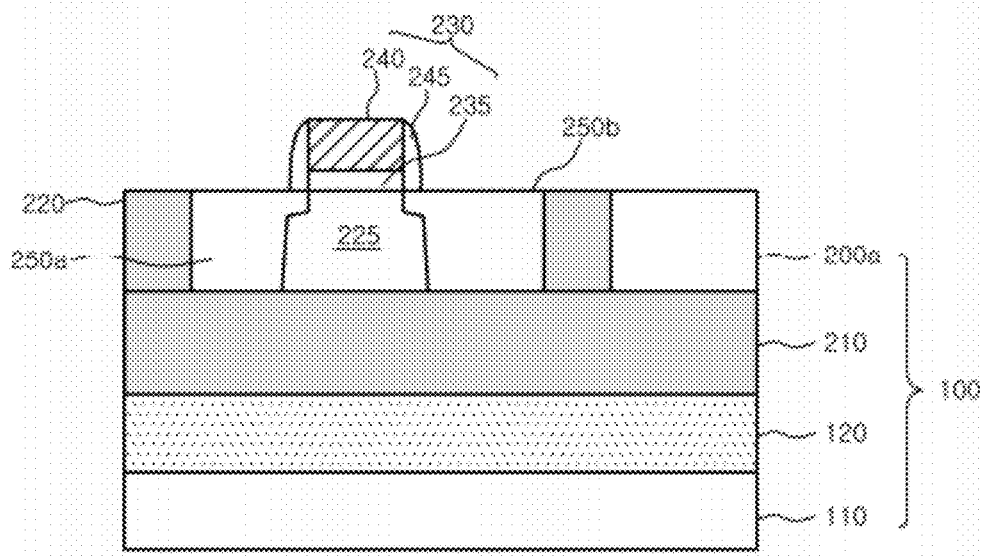

Referring to FIG. 6, the SOI substrate 100 can be formed by attaching the base substrate 110 to the attachment substrate 200. In one embodiment, the SOI substrate 100 can be formed through the attachment process of two substrates as shown in the figures. However, the SOI substrate can also be formed by forming an oxide layer, injecting impurity ions and then forming a well in the silicon substrate.

The device-forming layer 200a can be formed by applying the CMP (Chemical Mechanical Polishing) process to the surface of the attachment substrate 200 at a predetermined thickness. Shallow trenches (not shown) to expose a portion of the buried insulating layer 210 can be formed in the device-forming layer 200a and the is shallow trenches can be filled with insulation materials, thereby forming the STI-type isolation layer 220. Accordingly, the active region 225 can be defined within the device-forming layer 200a.

Next, after sequentially forming the gate oxide layer 235 and the gate oxide layer 240 on the device-forming layer 200a, these layers are patterned and the spacers 245 can be formed on the sidewalls of the patterned gate electrode 240, thereby forming the gate structure 230 or a gate electrode structure. At this time, the device-forming layer 200a can be a conducting layer, for example, a p-type conducting layer.

Thereafter, N-type impurity ions can be injected into the device-forming layer 200a, which is positioned at both sides of the gate structure 230, in order to form the source/drain regions 250 an and 250b.

Figure 7:
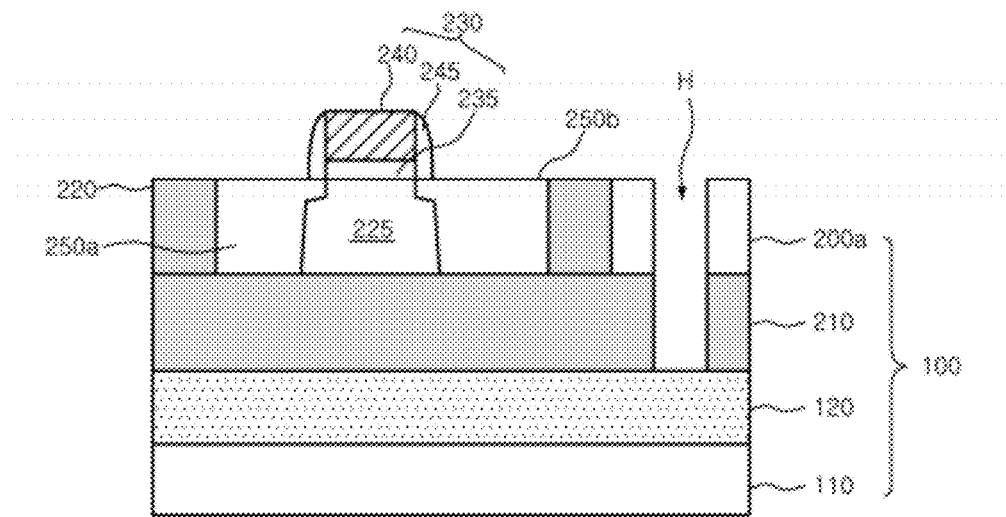

Referring to FIG. 7, a contact hole H, which exposes a portion of the well 120, can be formed by etching a portion of the device-forming layer 200a and the buried insulating layer 210, which are positioned outside of the active region 225. The contact plug 260 can be formed by filling the contact hole H with a conducting material. Thereafter, as shown in FIG. 7, metal wiring processes are carried out in such a manner that the word line select voltage VWL is applied to the gate structure 230, the ground voltage is applied to the source region 250a and the bit line voltage VBL is applied to the drain region 250b.

According to one embodiment of the present invention, the conducting material is provided to the bottom portion of the buried insulating layer 210 of the SOI substrate 100 such that the base substrate 110 has electrical conductivity. With the electrical conductivity of the base substrate 110, a capacitor (C) is formed by the accumulated holes 270 generated in the floating body, the buried insulating layer 210, and the base substrate 110. At this time, since the bias voltage applied to the base substrate 110 is variable, the accumulated holes 270 can be controlled for the charging/discharging operation of the capacitor (C).

As will be apparent from the above description, a SOI memory device configured as described herein can allow improved integration by providing a virtual capacitor through the formation of the well contact without an additional capacitor formed on and within the substrate.

Figure 8:
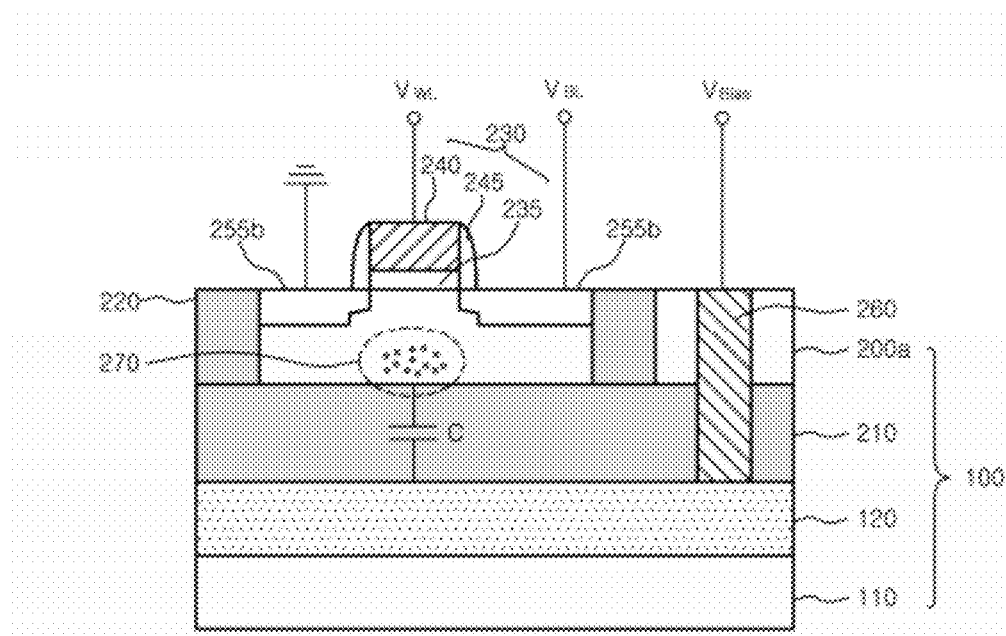
FIG. 8 is a cross-sectional view of a SOI memory device having a floating body capacitor according to another embodiment.

Although the embodiments described above are generally illustrated based on the fully-depleted transistor, a partially-depleted transistor (the depth of the depleted source/drain regions 255a and 225b is shallower than the thickness of the device-forming layer 200a, as shown in FIG. 8) can also be used.

It will be apparent to those skilled in the art that various modifications and changes may be made without departing from the scope and spirit of the embodiments described herein. Therefore, it should be understood that the above embodiments are not limitative, but illustrative in all aspects. The scope of the above embodiments are defined by the appended claims rather than by the description preceding them, and therefore all changes and modifications that fall is within metes and bounds of the claims, or equivalents of such metes and bounds are therefore intended to be embraced by the claims.

What is claimed is:

1. A semiconductor memory device comprising:
an SOI substrate with a base substrate on which a conducting surface, a buried insulating layer and a device-forming layer are stacked;
a switching transistor formed in a portion of the device-forming layer, having a gate, a source region and a drain region; and
a storage capacitor formed by the buried insulating layer, the conducting surface of the base substrate, and accumulated holes generated in an active area of the device-forming layer,
a contact plug that penetrates the device-forming layer and the buried insulating layer and is in contact with the conducting surface of the base substrate,
wherein the storage capacitor is electrically connected between a body of the switching transistor and a bias line, and charged or discharged in response to a driving of the switching transistor, and
wherein the portion of the device layer is insulated from an isolation layer and the buried insulating layer, and the contact plug is formed outside the isolating layer and the portion of the device-forming layer.

2. The semiconductor memory device of claim 1, wherein the base substrate having the conducting surface includes a conductive well formed in the base substrate, and wherein a variable bias voltage is applied to the conductive well.

3. The semiconductor memory device of claim 1, wherein the base substrate having the conducting surface includes a conducting layer, and wherein the conducting layer transmits an electrical signal.

4. The semiconductor memory device of claim 1, wherein sidewalls of the contact plug are contacted with an active area of the device-forming layer,
wherein the active area is an area which is formed in one memory cell constituted of the switching transistor and the storage capacitor.

5. The semiconductor memory device of claim 1, wherein the body of the switching transistor corresponds to the active area which is between the source region and the drain region.

6. The semiconductor memory device of claim 1, wherein the switching transistor is a fully depleted transistor.

7. The semiconductor memory device of claim 1, wherein the switching transistor is a partially depleted transistor.

8. The semiconductor memory device of claim 1, wherein the switching transistor has the gate connected with a word line, the source region connected with a ground terminal and drain region connected with a bit line.

9. A method for forming a semiconductor memory device comprising:
providing an SOI substrate, wherein the SOI substrate includes a base substrate having a conducting surface, a buried insulating layer and a device-forming layer;
forming a transistor having a gate, a source region and a drain region on the SOI substrate; and
forming a contact plug in contact with the conducting surface of the base substrate, wherein sidewalls of the contact plug are contacted with an area of the device-forming layer, and an adjustable bias voltage is applied to the contact plug,
wherein a storage capacitor is formed by connecting between the conducting surface and the active area, formed by the buried insulating layer, the conducting surface and accumulated holes generated in the active area, and
wherein the contact plug is formed outside of the source region and the drain region.

10. The method claim 9, wherein the providing of the SOI substrate includes:
preparing the base substrate having the conducting surface;
preparing an attachment substrate in which the buried insulating layer is formed; and
planarizing a surface of the attachment substrate and forming the device-forming layer is formed.

11. The method of claim 9, wherein the preparing of the base substrate having the conducting surface includes forming a conducting layer on the base substrate.

12. The method of claim 9, wherein the transistor has the gate connected with a word line, the source region connected with a ground terminal and a drain region connected with a bit line.

13. The method claim 11, wherein forming the conducting layer comprises forming a conductive well in the base substrate.

14. A memory cell array of the semiconductor memory device comprising:
a plurality of word lines;
a plurality of bit lines arranged to intersect with the plurality of the word lines, respectively; and
a plurality of memory cells formed in respective points of intersection of the plurality of word lines with the plurality of bit lines, respectively;
wherein one of the memory cells includes a switching transistor having a gate connected with one of the word lines, a source region connected with a ground terminal and a drain region connected with one of the bit lines, and a storage capacitor connected between a body of the switching transistor and a bias line,
wherein the storage capacitor is formed by a buried insulating layer formed under the active area, a conducting surface formed under the buried insulating layer and accumulated holes generated in the active area, and
wherein a contact plug is formed outside the drain region and a source region.

* * * * *